US010069039B2

(12) United States Patent
Boyama et al.

(10) Patent No.: US 10,069,039 B2
(45) Date of Patent: Sep. 4, 2018

(54) LIGHT-EMITTING DEVICE (71) Applicant: TOYODA GOSEI CO., LTD., Kiyosu-shi (JP)

(72) Inventors: Misato Boyama, Kiyosu (JP); Shingo Totani, Kiyosu (JP); Takashi Kawai, Kiyosu (JP)

(73) Assignee: TOYODA GOSEI CO., LTD, Kiyosu-shi, Aichi-ken (JP)

( * ) Notice: Subject to any disclaimer, the term of this patent is extended or adjusted under 35 U.S.C. 154(b) by 0 days.

(21) Appl. No.: 15/265,715

(22) Filed: Sep. 14, 2016

(65) Prior Publication Data

US 2017/0084782 A1    Mar. 23, 2017

(30) Foreign Application Priority Data

Sep. 21, 2015  (JP) .................................. 2015-186134

(51) Int. Cl.
| | |
|---|---|
| *H01L 33/00* | (2010.01) |
| *H01L 33/32* | (2010.01) |
| *H01L 27/15* | (2006.01) |
| *H01L 33/38* | (2010.01) |

(52) U.S. Cl.
CPC ............ *H01L 33/32* (2013.01); *H01L 27/156* (2013.01); *H01L 33/38* (2013.01)

(58) Field of Classification Search
CPC .............................. H01L 33/32; H01L 27/156
USPC ..................... 257/98, 99, 100, 103
See application file for complete search history.

(56) References Cited

U.S. PATENT DOCUMENTS

| | | | | |
|---|---|---|---|---|
| 9,818,731 | B2 * | 11/2017 | Kondoh | ............... H01L 25/0753 |
| 2011/0248836 | A1 * | 10/2011 | Brandes | ................ H01L 25/167 |
| | | | | 340/332 |

FOREIGN PATENT DOCUMENTS

| | | |
|---|---|---|
| JP | S57-167688 A | 10/1982 |
| JP | H11-330535 A | 11/1999 |
| JP | 2000-114580 A | 4/2000 |
| JP | 2002-314130 A | 10/2002 |
| JP | 2003-347584 A | 12/2003 |
| JP | 2004-055855 A | 2/2004 |
| JP | 2007-234672 A | 9/2007 |
| JP | 2011-222126 A | 11/2011 |

(Continued)

OTHER PUBLICATIONS

Japanese Office Action dated Jul. 17, 2018, with an English translation.

(Continued)

*Primary Examiner* — Tan N Tran (74) *Attorney, Agent, or Firm* — McGinn IP Law Group, PLLC (57) ABSTRACT

The present invention provides a light-emitting device suppressing the reduction in the light output while improving the response speed. As shown in FIG. 1, the light-emitting device comprises four square element regions arranged with the sides of the element regions aligned in a two by two lattice. The light-emitting regions are disposed in the vicinity of corners at the center side of the element regions, and the light-emitting regions are localized in the vicinity of the center in the entire element region. A plane pattern of each of the light-emitting regions is formed so that plane patterns of p-electrodes and n-electrodes are not disposed in a region sandwiched by the light-emitting regions.

12 Claims, 4 Drawing Sheets

(56) References Cited

FOREIGN PATENT DOCUMENTS

WO          WO 00/19543 A1      4/2000

OTHER PUBLICATIONS

Chinese Office Action dated Jun. 25, 2018, with an English translation.

* cited by examiner

LIGHT-EMITTING DEVICE

BACKGROUND OF THE INVENTION

Field of the Invention

The present invention relates to a Group III nitride semiconductor light-emitting device, more specifically, a light-emitting device having a structure suitable for optical communication and having characteristics in light-emitting region.

Background Art

In short-distance optical fiber communication, POF (Plastic Optical Fiber) has been widely employed because it is inexpensive and resistant to bending. Since the POF exhibits low loss in a green band, Group III nitride semiconductor green light-emitting device is suitable as a light source for the POF. In such communication usage, the response speed of the light-emitting device is preferably fast. However, the response speed of the green light-emitting device is slow, and improvement is required.

A method of reducing the light-emitting area is known to improve the response speed of the light-emitting device (Patent Documents 1 to 3).

Patent Document 1 discloses a structure in which a p-pad electrode and a transparent electrode are formed apart from each other on a p-type layer, and a diffusion electrode is extended from the p-pad electrode to connect to the outer periphery of the transparent electrode. A region having the transparent electrode becomes an emission region by achieving better ohmic characteristics for the p-type layer in the transparent electrode than in the diffusion electrode.

Patent Documents 2 and 3 describe a flip-chip type Group III nitride semiconductor light-emitting device employed for optical communication. Patent Document 2 describes that an insulating film having a window is formed between the p-type layer and the reflection electrode, the current is interrupted in the region where the insulating film was formed, an electric conduction is obtained only in the window, thereby the window region becomes the emission region, and that the thickness of the insulating film is arranged to be one fourth of the wavelength of the emitted light, thereby improving the directivity of the optical axis direction. Patent Document 3 describes that the emission region is reduced by reducing an area of contact between an ohmic electrode and a p-type layer, thereby improving the response rate.

Patent Document 1: Japanese Patent Application Laid-Open (kokai) No. 2002-314130
Patent Document 2: Japanese Patent Application Laid-Open (kokai) No. 2003-347584
Patent Document 3: Japanese Patent Application Laid-Open (kokai) No. 2004-55855

However, there was a problem that the light output is reduced when the response speed is improved by reducing the light-emitting area.

SUMMARY OF THE INVENTION

In view of the foregoing, an object of the present invention is to improve the reduction in the light output while increasing the response speed.

In an aspect of the present invention, there is provided a Group III nitride semiconductor light-emitting device having a plurality of element regions, each of the element regions emitting light and having electrodes, wherein the element regions are separated at the center of the entire light-emitting device in a plan view, each light-emitting region of each element region is disposed in the vicinity of the center, and the electrodes of each element region are disposed outside a region sandwiched by the light-emitting regions in a plan view.

The present invention is effective especially for a green light-emitting device because the response speed is more difficult to improve in the green light-emitting device than in the blue light-emitting device. The center wavelength of green light emission is in a range of 490 nm to 570 nm, and, more preferably, 500 nm to 530 nm.

The light-emitting device of the present invention is especially effective as a light source for optical communication using POF (Plastic Optical Fiber). The light-emitting device of the present invention allows both the improvement of the response speed and the suppression of the reduction in the light output by reducing the light-emitting area.

The element region refers to a region having an independent device function, which may be separated for each substrate (i.e., separated for each chip), or may be formed by electrically separating the semiconductor layer by a trench or the like without separating the substrate (a monolithic structure). The center of the entire light-emitting device is the center of a circumcircle including the entire light-emitting device.

A plane pattern of each light-emitting region is localized in the vicinity of the center of the entire light-emitting device. When an area of the plane pattern of each light-emitting region is equally divided into two regions near and far from the center by a straight line, each light-emitting region is preferably included in the region near the center O, thereby concentrating more light to the center.

When the light-emitting device of the present invention is employed as a light source for optical communication using POF, all the plane patterns of the light-emitting regions are preferably included in a circle with the center of the entire light-emitting device as a center and with a diameter of half the POF core diameter. The light can be efficiently incident on the POF core. A general POF core has a diameter of about 1 mm, and therefore the entire plane pattern including all the light-emitting regions is preferably included in a circle with the center of the entire light-emitting device as a center and with a diameter of 0.5 mm.

The area of each light-emitting region is preferably 1% to 30% of the area of each element region to sufficiently improve the response speed by reducing the light-emitting area. For similar reasons, the area of each light-emitting region is preferably equal to or less than the area of the electrodes for the light-emitting region (i.e., the total area of the p-electrode and the n-electrode).

Each element region and each light-emitting region preferably have the following simple structure to facilitate the production. One is that the element regions are separated into four in a two by two lattice at the center, and each light-emitting region is disposed in the vicinity of a corner at the center side of each element region. The other is that the element regions are separated into two at the center, and each light-emitting region is disposed in the vicinity of the side at the center of each element region.

The present invention can achieve sufficient light output while improving the response speed. That is, the response speed can be improved by reducing the area of each light-emitting region. Since the lights emitted from a plurality of light-emitting regions are concentrated to the center, sufficient light output can be obtained while suppressing the reduction in the light output by reducing the light-emitting area. Particularly, the light can be sufficiently incident on the POF.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
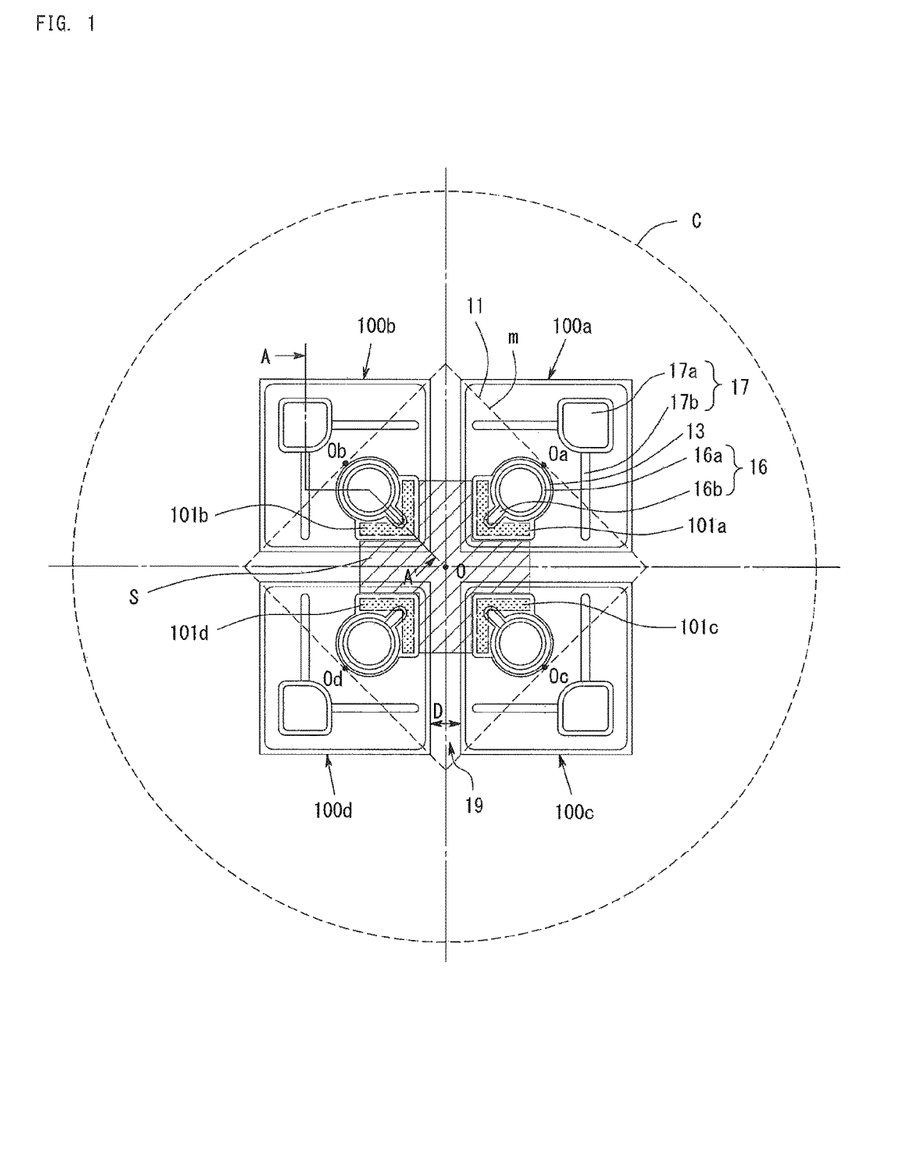
FIG. 1 is a plan view showing the structure of a light-emitting device according to Embodiment 1.
Figure 2:
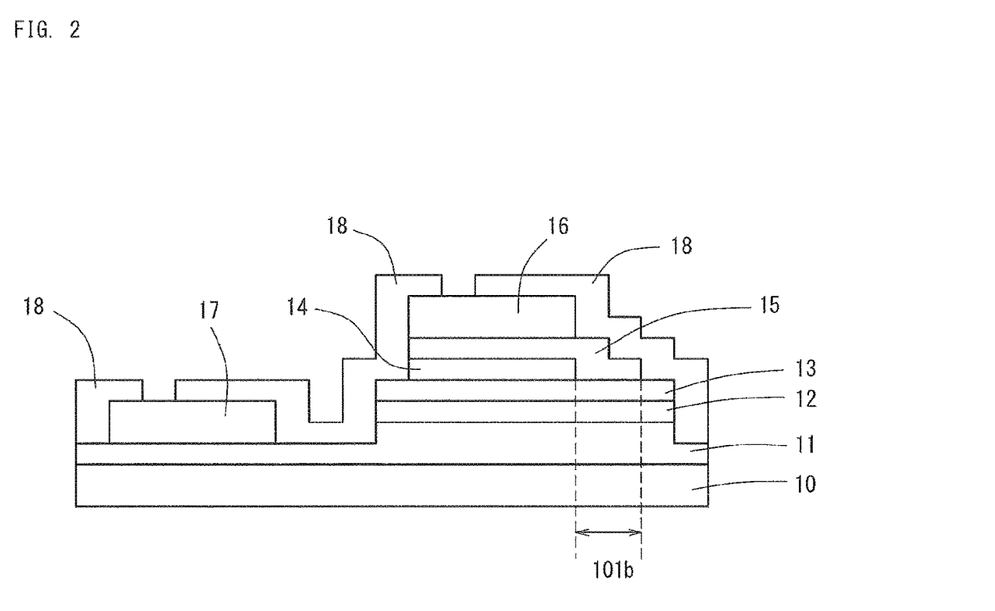
FIG. 2 is a cross-sectional view showing the structure of the light-emitting device according to Embodiment 1.

FIG. 1 is a plan view showing the structure of a light-emitting device according to Embodiment 1. FIG. 2 is a cross-sectional view showing the structure of the light-emitting device according to Embodiment 1. The cross sectional view of FIG. 2 is a cross section taken along the line A-A' of FIG. 1. The light-emitting device according to Embodiment 1 is of a face-up type. Light is extracted from the back to the front in a direction perpendicular to a paper plane in FIG. 1. The light-emitting device according to Embodiment 1 achieves green light emission (having a center wavelength of 490 nm to 570 nm) suitable for short-distance optical communication using POF.

As shown in FIG. 2, the light-emitting device according to Embodiment 1 comprises a substrate 10, an n-type layer 11, a light-emitting layer 12, and a p-type layer 13 sequentially deposited on the substrate 10, each of them being Group III nitride semiconductor, a current blocking layer 14 formed in a predetermined region on the p-type layer 13, a transparent electrode 15 formed on the p-type layer 13 and the current blocking layer 14, a p-electrode 16 formed on the transparent electrode 15, and an n-electrode 17 formed on the n-type layer 11 exposed by a trench. The structures of the layers are described in details later.

Next will be described the plane pattern of the light-emitting device according to Embodiment 1 with reference to FIG. 1.

As shown in FIG. 1, in the light-emitting device according to Embodiment 1, four square element regions 100a to 100d are arranged in a two by two lattice so that two sides of two arbitrary adjacent square element regions are aligned with respect to each other. Each of the four element regions 100a to 100d has the same structure, and is one square chip with one side length of 230 μm in a plan view. These four element regions 100a to 100d are connected in series or in parallel when the light-emitting device according to Embodiment 1 is mounted. The predetermined regions (light-emitting regions 101a to 101d) of the element regions 100a to 100d emit light. The four element regions 100a to 100d are spaced apart by a gap 19. The gap 19 is a plane pattern having a cross shape crossing at the center O of the plane pattern of the entire light-emitting device. The width D of the gap 19 (space between the adjacent element regions 100a to 100d) is 20 μm. Thus, the element regions 100a to 100d are arranged at an interval of the gap 19, thereby reducing the absorption of light between the adjacent element regions 100a to 100d.

The light-emitting device may have a so-called monolithic structure in which four element regions 100a to 100d are formed on one chip without arranging four chips two by two. That is, four electrically separated element regions 100a to 100d may be formed by depositing an n-type layer 11, a light-emitting layer 12, and a p-type layer 13 on one substrate 10, forming a trench extending from the p-type layer 13 to at least the n-type layer 11, and making the plane pattern of the trench same as the gap 19.

The width D of the gap 19 is not limited to the above value, but preferably, 5 μm to 50 μm. When the width D is less than 5 μm, sufficient light cannot be extracted from the side surface, which is not desirable. When the width D is more than 50 μm, the light-emitting regions 101a to 101d come apart from the center O so that light emission is not concentrated to the center O, which is not desirable. Therefore, the width D is, more preferably, 5 μm to 30 μm, and, further preferably, 10 μm to 20 μm.

As shown in FIG. 1, the light-emitting regions 101a to 101d are disposed in the vicinity of the corners at the center O side of the element regions 100a to 100d, and the light-emitting regions 101a to 101d are localized in the vicinity of the center O in the entire element regions 100a to 100d. Although the light output of each of the light-emitting regions 101a to 101d is reduced when the response speed is improved by reducing the area of each of the light-emitting regions 101a to 101d, the reduction in the light output is suppressed as a whole by concentrating the lights emitted from the entire light-emitting regions 101a to 101d to the center O.

The area of each of the light-emitting regions 101a to 101d is preferably 1% to 30% of the area of each of the element regions 100a to 100d. The response speed can be sufficiently improved by reducing the light-emitting area, and a light-emitting device suitable for optical communication can be achieved. The area of each light-emitting region is, more preferably, 1% to 20%, and, further preferably, 1% to 10%. For the same reasons, the area of each of the light-emitting regions 101a to 101d is preferably equal to or less than the total area of the p-electrode 16 and the n-electrode 17.

The entire plane pattern of the light-emitting regions 101a to 101d is preferably concentrated to the center O to improve the incidence efficiency of light when the light-emitting device according to Embodiment 1 is employed for optical communication using POF.

More specifically, all the plane patterns of the light-emitting regions 101a to 101d are preferably included in a circle with the center O as a center and with a diameter of half the POF core diameter. In FIG. 1, a circle C drawn by a dotted line indicates the outer edge of the POF core. All the plane patterns of the light-emitting regions are more preferably included in a circle with the center O as a center and with a diameter of one-quarter the POF core diameter. A general POF core has a diameter of about 1 mm, and therefore the entire plane pattern of the light-emitting regions 101a to 101d is preferably included in a circle with the center O as a center and with a diameter of 0.5 mm (more preferably 0.25 mm).

When the plane pattern of each of the element regions 100a to 100d is equally divided into two regions near and far from the center O by a straight line, each of the light-emitting regions 101a to 101d is preferably included in the region near the center O. The straight line dividing the two regions is a straight line perpendicular to the line connecting the respective centers Oa to Od of each of the element regions 100a to 100d and the center O of the entire light-emitting device. In FIG. 1, the straight lines m dividing the light-emitting regions into two regions are indicated by a dotted line. When each of the element regions 100a to 100d has a square shape as in Embodiment 1, each straight line m is a diagonal line of the square. More preferably, when the area of each of the element regions 100a to 100d is divided into one to four regions near and far from the center O by a straight line, that is, an area of the near region of any one of the element regions is ⅕ of the total area of the element region, each of the light-emitting regions 101a to 101d is included in the region near the center O.

The plane pattern of each of the light-emitting regions 101a to 101d has a symmetrical L-shape as shown in FIG. 1, and all the plane patterns are the same. The L-shaped pattern of each of the light-emitting regions 101a to 101d, is disposed in the vicinity of the corner at the center O side in each of the element regions 100a to 100d, the sides of the L shape are aligned in parallel with the sides of the element regions 100a to 100d, and the corner of the L shape is disposed toward the center O.

The plane pattern of each of the light-emitting regions 101a to 101d is not limited to the above, and any pattern may be employed, for example, a rectangle, a square, a diamond, a circle, a semicircle, and a quarter circle. The POF core is generally a circle. If the plane pattern of each of the light-emitting regions 101a to 101d is a quarter circle, and the vertex of each quarter circle is directed toward the center, the entire plane pattern of the light-emitting regions 101a to 101d is close to a circle. Thereby, the efficiency of light incident on the POF core is expected to be improved.

The electrode pattern in each of the element regions 100a to 100d is as shown in FIG. 1.

The p-electrode 16 comprises a p-pad 16a and a p-wiring 16b being connected to the p-pad 16a and extending in a straight line. The p-wiring 16b achieves uniform light emission. The plane pattern of the p-pad 16a is a circle, and the center of the circle is slightly dislocated from the respective centers Oa to Od of each of the element regions 100a to 100d toward the center O of the light-emitting device. The plane pattern of the p-wiring 16b is in a thin line extending from the p-pad 16a to the center O. Each of the light-emitting regions 101a to 101d is disposed closer to the center O side than the p-electrode 16 so that the plane pattern of each of the light-emitting regions 101a to 101d does not overlap the plane pattern of the p-electrode 16.

The n-electrode 17 comprises an n-pad 17a and two n-wirings 17b being connected to the n-pad 17a and extending in a straight line. The n-wiring 17b achieves uniform light emission. The plane pattern of the n-pad 17a is a square having a round corner at the center O side, and is disposed at the corner opposite to the center O side of each of the light-emitting regions 101a to 101d. The plane pattern of the n-wirings 17b is in two mutually perpendicular lines extending from the n-pad 17a along the sides of each of the light-emitting regions 101a to 101d.

The plane pattern of each of the light-emitting regions 101a to 101d is formed so that the plane patterns of the p-electrode 16 and the n-electrode 17 are not disposed in a region S sandwiched by the light-emitting regions 101a to 101d. That is, the plane patterns of the p-electrode 16 and the n-electrode 17 are disposed outside the region S. Such plane patterns of the light-emitting regions 101a to 101d suppress the light emission concentrated to the center O from being absorbed and shielded by the p-electrodes 16 and the n-electrodes 17, thereby improving the efficiency of light incident on the POF.

Next will be described the structures of the layers of the light-emitting device according to Embodiment 1 with reference to FIG. 2.

The substrate 10 is a sapphire substrate having irregularities (not illustrated) on the surface at the n-type layer 11 side thereof. The irregularities are formed to improve the light extraction efficiency. The substrate 10 is made of sapphire. Other than sapphire substrate, a substrate made of materials on which Group III nitride semiconductor can be crystal grown, for example, SiC, Si, and ZnO, may be employed.

The n-type layer 11 has a structure in which an n-type contact layer, an n-type ESD layer, and an n-type SL layer are sequentially deposited on the substrate 10. The n-type contact layer is a layer contacting with the n-electrode 17. The n-type contact layer is made of n-GaN having a Si concentration of $1 \times 10^{18}/cm^3$ or higher. The n-type contact layer may comprise a plurality of layers having different carrier concentrations, thereby reducing the contact resistance of the n-electrode 17. The n-type ESD layer is an electrostatic breakdown-preventing layer for preventing electrostatic breakdown of the light-emitting device. The n-type ESD layer has a deposition structure of undoped GaN and Si-doped n-GaN. The n-type SL layer is an n-type superlattice layer having a superlattice structure in which a plurality of layer units are repeatedly deposited, each layer unit comprising InGaN, GaN, and n-GaN sequentially deposited. The n-type SL layer is a layer for relaxing stress applied to the light-emitting layer 12.

The light-emitting layer 12 has a MQW structure in which an InGaN well layer and an AlGaN barrier layer are repeatedly deposited. The In composition ratio of the well layer is adjusted to generate green light emission (having a center wavelength of 490 nm to 570 nm). A protective layer for preventing the evaporation of In may be formed between the well layer and the barrier layer.

The p-type layer 13 has a structure in which a p-type cladding layer and a p-type contact layer are sequentially deposited on the light-emitting layer 12. The p-type cladding layer is a layer for preventing diffusion of electrons to the p-type contact layer. The p-type cladding layer has a structure in which a plurality of layer units are repeatedly deposited, each layer unit comprising p-InGaN and p-AlGaN sequentially deposited. The p-type contact layer is a layer for achieving good contact between the p-electrode 16 and the p-type layer 13. The p-type contact layer is made of p-GaN having an Mg concentration of $1 \times 10^{19}/cm^3$ to $1 \times 10^{22}/cm^3$ and a thickness of 100 Å to 1000 Å.

Of the light-emitting layer 12 and the p-type layer 13, only a region on which the p-electrodes 16 are formed and a region being the light-emitting regions 101a to 101d are remained in an island shape, and other regions are removed by etching. The n-type layer 11 is exposed in the etched bottom. The area of the light-emitting regions 101a to 101d is efficiently reduced by leaving the light-emitting layer 12 and the p-type layer 13 in this way.

The structures of the n-type layer 11, the light-emitting layer 12, and the p-type layer 13 are not limited to the above. Any structure conventionally used in the Group III nitride semiconductor light-emitting device may be employed.

The current blocking layer 14 is made of $SiO_2$, and provided in a predetermined region on the p-type layer 13. The thickness of the current blocking layer 14 is 100 nm. The current blocking layer 14 blocks the current in the predetermined region so that the light-emitting regions 101a to 101d have the plane patterns shown in FIG. 1. The plane patterns of the light-emitting regions 101a to 101d do not overlap the plane patterns of the p-electrodes 16. This is to suppress the light absorption and shielding by the p-electrode 16 by preventing the regions just below the p-electrodes 16 from emitting a light and by reflecting the light directed to the p-electrode 16 from the light-emitting layer by the current blocking layer 14.

The current blocking layer 14 may be made of various insulators including oxide such as SiON, $Al_2O_3$, $TiO_2$, $ZrO_2$, $HfO_2$, and $Nb_2O_5$, other than $SiO_2$, nitride such as AlN, and SiN, carbide such as SiC, and fluoride. The current blocking layer 14 may be a single layer or a multiple layer made of the above materials. The crystal structure may be single crystal, polycrystal, or amorphous. Moreover, the current blocking layer 14 may be a dielectric multilayer film in which two types of films having the same optical film thickness of ¼ wavelength and different refractive indices are alternately deposited. Light directed to the p-electrode 16 is reflected by the current blocking layer 14, and reduced so that the light absorption by the p-electrode 16 is reduced, thereby improving the emission efficiency.

The transparent electrode 15 is made of IZO (zinc-doped indium oxide). The transparent electrode 15 is continuously formed on the p-type layer 13 and the current blocking layer 14. In a plan view, regions where the p-type layer 13 is in contact with the transparent electrode 15 become the light-emitting regions 101a to 101d. The thickness of the transparent electrode 15 is 200 nm. The transparent electrode 15 may be formed of indium oxide-based material such as ITO (indium tin oxide) and ICO (cerium-doped indium oxide), or other transparent conductive oxide, other than IZO.

The p-electrode 16 and the n-electrode 17 are formed of Ni/Au/Al. The Ni film has a thickness of 50 nm, the Au film has a thickness of 1500 nm, and the Al film has a thickness of 10 nm. The p-electrode 16 is disposed in a predetermined region on the transparent electrode 15. The plane pattern of the p-electrode 16 is as shown in FIG. 1. The n-electrode 17 is disposed in a predetermined region on the n-type layer 11 exposed by etching. The plane pattern of the n-electrode 17 is as shown in FIG. 1.

Figure 3:
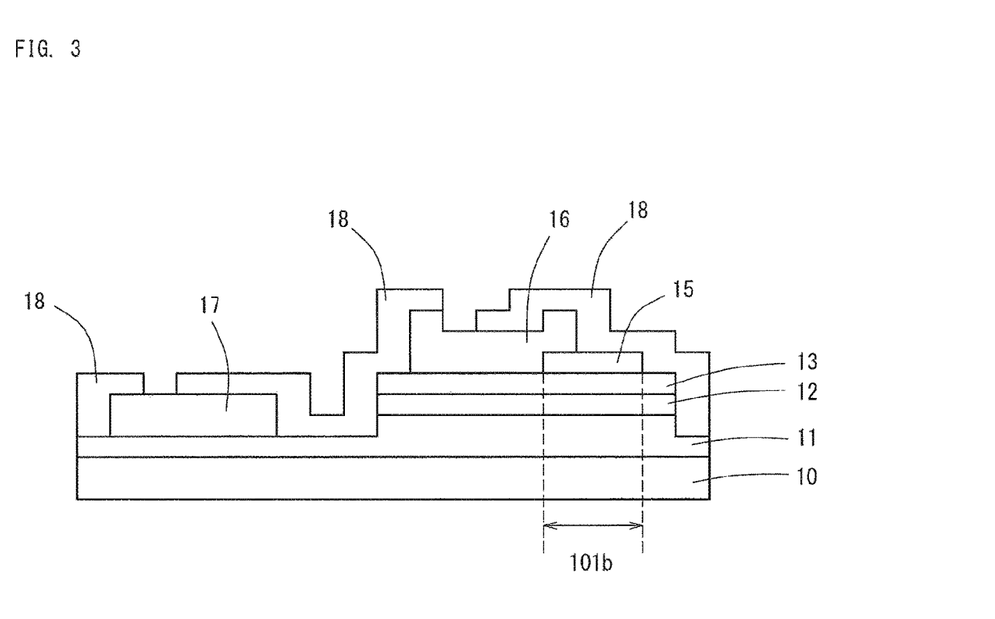
FIG. 3 is a cross-sectional view showing the structure of a light-emitting device according to other variation.

As shown in FIG. 3, instead of forming the current blocking layer 14, the p-electrode 16 may be in direct contact with the p-type layer 13 in the predetermined region. Since the transparent electrode 15 has better contact with the p-type layer 13 than the p-electrode 16, the current flows from the p-electrode 16 to the p-type layer 13 via the transparent electrode 15, and does not flow to the region where the p-electrode 16 is in contact with the p-type layer 13. Therefore, the plane pattern of the light-emitting region may be the same as shown in FIG. 1.

The insulating film 18 is formed so as to cover the top surfaces of the element regions 100a to 100d, that is, on the region except for the top surfaces of the p-pad 16a of the p-electrode 16 and the n-pad 17a of the n-electrode 17. The insulating film 18 is made of $SiO_2$.

As mentioned above, in the light-emitting device according to Embodiment 1, the element regions are separated into four element regions 100a to 100d, two by two at the center O, and the area of each of the light-emitting regions 101a to 101d in each of the element regions 100a to 100d is reduced, thereby improving the response speed. Each of the light-emitting regions 101a to 101d is localized in the vicinity of the center O to concentrate light, and the plane patterns of the p-electrode 16 and the n-electrode 17 are not disposed in the region S sandwiched by the light-emitting regions 101a to 101d. Thereby, a sufficient light output is obtained for optical communication using POF, and the reduction in the light output is suppressed.

Embodiment 2

Figure 4:
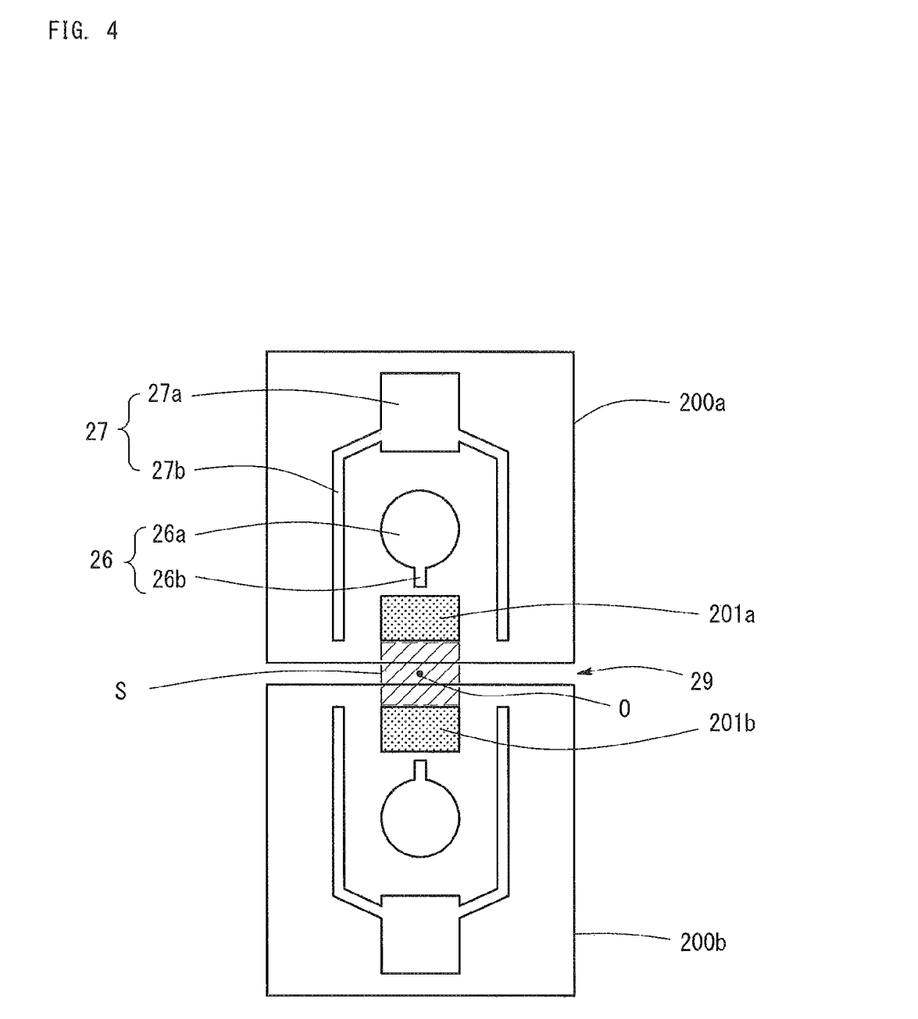
FIG. 4 is a plan view showing the structure of a light-emitting device according to Embodiment 2.

The structure of the light-emitting device according to Embodiment 2 is the same as that of the light-emitting device according to Embodiment 1 except that the plane patterns of the element regions 100a to 100d, the light-emitting regions 101a to 101d, the p-electrodes 16, and the n-electrodes 17 are changed as shown in FIG. 4.

As shown in FIG. 4, in the light-emitting device according to Embodiment 2, two square element regions 200a and 200b are arranged with the sides aligned. Each of the element regions 200a and 200b is a square chip of 230 μm×230 μm having the same structure in a plan view. The two element regions 200a and 200b are connected in series or in parallel when the light-emitting device according to Embodiment 2 is actually mounted. Light is emitted from predetermined regions (the light-emitting regions 201a and 201b) of the element regions 200a and 200b. The two element regions 200a and 200b are spaced apart by a gap 29.

The light-emitting regions 201a and 201b are arranged in the vicinity of the sides at the center O side of the element regions 200a and 200b as shown in FIG. 4. In the entire element regions 200a and 200b, the light-emitting regions 201a and 201b are localized in the vicinity of the center O. When the response speed is improved by reducing the light-emitting regions 201a and 201b, the light output is reduced in each of the light-emitting regions 201a and 201b. However, the reduction in the entire light output is suppressed by concentrating the lights emitted from the entire light-emitting regions 201a and 201b to the center O. The preferable area and range of the light-emitting regions 201a and 201b are the same as those of the light-emitting regions 101a to 101d of Embodiment 1.

The p-electrode 26 comprises a p-pad 26a and a p-wiring 26b being connected to the p-pad 26a and extending in a straight line. The plane pattern of the p-pad 26a is a circle. The center of the circle is slightly dislocated from the center of each of the element regions 200a and 200b to the center O side of the entire light-emitting device. The plane pattern of the p-wiring 26b is in a thin line extending from the p-pad 26a toward the center O. Each of the light-emitting regions 201a and 201b is disposed closer to the center O side than the p-electrode 26 so that the plane pattern of each of the light-emitting regions 201a and 201b does not overlap the plane pattern of the p-electrode 26.

The n-electrode 27 comprises an n-pad 27a and two n-wirings 27b being connected to the n-pad 27a and extending in a U-shape. The plane pattern of the n-pad 27a is a square, and disposed in the vicinity of the side opposite to the center O side. The plane pattern of the n-wirings 27b is in two lines extending from the n-pad 27a so as to surround the light-emitting region 201a or the p-electrode 26 in a U shape.

The plane pattern of each of the light-emitting regions 201a and 201b is formed so that the plane patterns of the p-electrode 26 and the n-electrode 27 are not disposed in a region S sandwiched by the light-emitting regions 201*a* and 201*b*. Such plane patterns of the light-emitting regions 201*a* and 201*b* suppress the light emission concentrated to the center O from being absorbed and shielded by the p-electrode 26 and the n-electrode 27, thereby improving the efficiency of light incident on the POF.

The light-emitting device according to Embodiment 2 also suppresses the reduction in the light output while improving the response speed as in the light-emitting device according to Embodiment 1. Thereby, a sufficient light output is obtained for optical communication using POF.

Variation

In the light-emitting device according to Embodiment 1, the element regions are separated into four regions, two by two at the center of the entire light-emitting device. In the light-emitting device according to Embodiment 2, the element regions are separated into two regions at the center. In the present invention, as long as the element regions are separated into at least two regions at the center (the center of a circumcircle including the entire light-emitting region, and a range deviated from the center by a distance of one tenth of the radius of the circumcircle is accepted as a tolerance), the pattern may not be symmetrically separated, and each element region may not have the same pattern. However, preferably, the element regions are separated as in Embodiments 1 and 2, and each element region has the same pattern in terms of the easiness of producing a light-emitting device. Moreover, all the element regions are preferably included in a circle with the center of the entire light-emitting device as a center and with the same diameter as the diameter of the POF core to improve the efficiency of light incident on the POF core. As long as each of the element regions is at least electrically separated from each other, the element regions may be separated for each chip and may have a monolithic structure.

The plane pattern of each light-emitting region is not limited to the ones shown in Embodiments 1 and 2. Any pattern may be employed as long as the following conditions are satisfied. Firstly, the plane pattern of each light-emitting region is localized in the vicinity of the center of the entire light-emitting device. How much localized the plane pattern is in the vicinity of the center, is as shown in Embodiment 1. That is, all the plane patterns of the light-emitting regions are preferably included in a circle with the center of the entire light-emitting device as a center and with a diameter of half the POF core diameter (more preferably one-quarter the POF core diameter). Secondly, the plane pattern of each light-emitting region is formed so that the plane patterns of the p-electrode 16 and the n-electrode 17 are not disposed in a region sandwiched by the light-emitting regions. Each light-emitting region may not have the same pattern. However, the same pattern is preferable to achieve uniform light emission and improve the efficiency of light incident on the POF.

As long as a part or all the plane patterns of the p-electrode and the n-electrode are not in a region sandwiched by the light-emitting regions, any pattern may be employed. However, as in Embodiments 1 and 2, the p-electrode 16 and the n-electrode 17 preferably have a wiring pattern to uniformly diffuse current and achieve uniform light emission of the light-emitting region. Particularly, the wiring of the p-electrode 16 or the n-electrode 17 preferably has the plane pattern extending along the side in the vicinity of the side where the element region are not adjacent to each other.

The light-emitting device of the present invention has a feature in the plane patterns or arrangement of the element regions, the light-emitting regions, the p-electrode, and the n-electrodes. Any conventionally known structure may be employed without limiting to a face-up type light-emitting device as shown in Embodiments 1 and 2.

Figure 5:
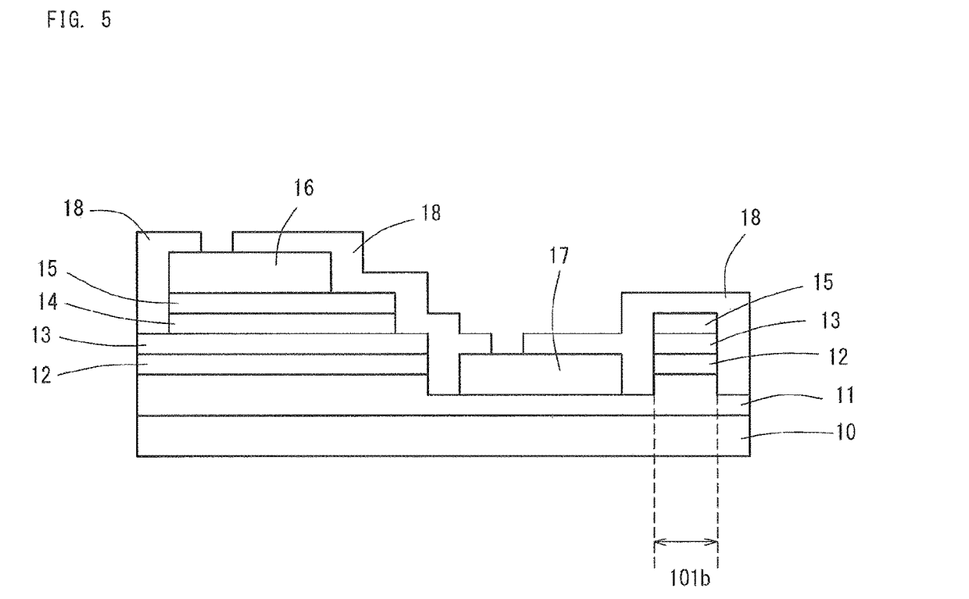
FIG. 5 is a cross-sectional view showing the structure of a light-emitting device according to other variation.

For example, the present invention may be applied to a flip-chip type light-emitting device or a vertical type light-emitting device. The present invention may also be applied to the structure as shown in FIG. 5, in which the positions of the n-electrode and the p-electrode are reversed compared with Embodiments 1 and 2. That is, the n-electrode 17 is formed in a circle on the n-type layer 11 exposed by etching from the p-type layer in FIG. 5. The light-emitting layer 12, the p-type layer 13, and the transparent electrode 15 are continuous except for region on which the n-electrode 17 is formed. The current blocking layer 14 is formed under the transparent electrode 15 in the region other than the light-emitting regions 101*a* to 101*d*. Even for such a reversed structure, the plane patterns of the light-emitting regions 101*a* to 101*d* may not be changed. FIG. 5 shows a cross section A-A' when the reversed structure is employed in the light-emitting device according to Embodiment 1.

Figure 6:
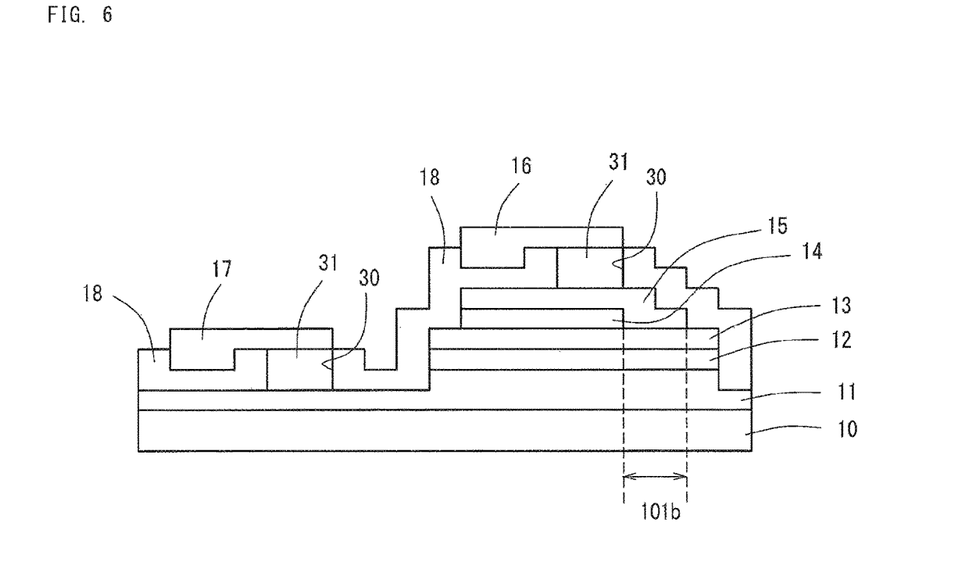
FIG. 6 is a cross-sectional view showing the structure of a light-emitting device according to other variation.

As shown in FIG. 6, the p-electrode 16 and the n-electrode 17 are not formed directly on the transparent electrode 15 and the n-type layer 11. The p-electrode 16 or the n-electrode 17 is formed on the insulating film. Through dot-shaped holes 30 opened on the insulating film 18, the p-electrode 16 and the n-electrode 17 may be respectively connected to the transparent electrode 15 and the n-type layer 11. At this time, contact electrodes 31 may be formed at positions of the holes 30 on the transparent electrode 15 and on the n-type layer 11 to establish good contact with the p-electrode 16 and the n-electrode 17. At this time, reflective films may be formed in regions overlapping the p-electrode 16 and the n-electrode 17 of the insulating film 18 in a plan view to reduce the light absorption and shielding by the p-electrode 16 and the n-electrode 17.

The present invention is effective especially for a flip-chip type device (for example, a light-emitting device in FIG. 6) of the above various structures. In the flip-chip type device, light is not shielded by a bonding wire when actually mounted so that the light emitted from the light-emitting device can be efficiently incident on the POF core.

The present invention may be applied to a light-emitting device other than a green light-emitting device having a center wavelength of 490 nm to 570 nm. However, the response speed is more difficult to improve in the green light-emitting device than in the light-emitting device having emission wavelength other than green band. Therefore, the present invention is effective especially for such green light-emitting device. Since the POF has low light loss in green band, the present invention is effective especially for a light-emitting device for optical communication using POF, and more preferably, for a light-emitting device having a center wavelength of 510 nm to 550 nm.

The light-emitting device of the present invention may be employed as a light source for optical communication, and especially as a light source for short-distance communication using POF.

What is claimed is:

1. A Group III nitride semiconductor light-emitting device comprising:
    a plurality of element regions having group III nitride semiconductor layers in an entire area thereof, each of the element regions having respective light-emitting regions emitting light outside and having a p-electrode and an n-electrode, wherein the element regions are separated into four in a two by two lattice around a device center as a center of the entire light-emitting device in a plan view;

wherein each of the light-emitting regions of each element region is localized in a vicinity of one specific corner among four corners of the element region, the specific corner being a nearest corner to the device center, and an area of each light-emitting region is 1% to 30% of the entire area of each element region;

wherein when an area of a plane pattern of the element region is equally divided into two regions near and far from the device center by a straight line, the light-emitting region is localized in a region near the device center; and wherein the p-electrodes are disposed between the light-emitting region and the n-electrode in a plan view.

2. The light-emitting device according to claim 1, wherein all plane patterns of the light-emitting regions are included in a circle with the device center as a center and with a diameter of 0.5 mm.

3. The light-emitting device according to claim 1, wherein a gap of 5 µm to 50 µm is formed between adjacent element regions.

4. The light-emitting device according to claim 1, wherein green light emission is achieved.

5. The light-emitting device according to claim 1, the light-emitting device is employed as a light source for optical communication using plastic optical fiber.

6. The light-emitting device according to claim 5, wherein all the plane patterns of the light-emitting regions are included in a circle with the device center as a center and with a diameter of half a core diameter of the plastic optical fiber.

7. The light-emitting device according to claim 1, wherein each of the light-emitting regions has a L-shape whose corner is disposed in the vicinity of the specific corner, and two sides of the L shape are aligned in parallel with two sides of the element region which makes the specific corner.

8. The light-emitting device according to claim 1, wherein each of the light-emitting regions has a shape of quarter circle, and the vertex of each quarter circle is directed toward the device center.

9. The light-emitting device according to claim 1, wherein the n-electrode comprises an n-pad disposed in a vicinity of a diagonal corner opposite to the specific corner and two n-wirings which are connected to the n-pad and extended in two straight lines, each of the straight lines being parallel to two sides making the diagonal corner of the light-emitting region.

10. The light-emitting device according to claim 1, wherein each of the element regions comprises a p-type layer, a transparent electrode and a current blocking layer, the current blocking layer is formed on a part of the surface of the p-type layer and the light-emitting region is formed as an area where the transparent electrode is directly contacted with the p-type layer.

11. The light-emitting device according to claim 1, wherein the four element regions comprises a common continuous substrate and a trench extending from a p-type layer to at least an n-type layer, the p-type layer and the n-type layer being one layer of the group III nitride semiconductor layers.

12. A Group III nitride semiconductor light-emitting device comprising:

a plurality of element regions having a group III nitride semiconductor layer in an entire area thereof, each of the element regions having respective light-emitting regions emitting light outside and having a p-electrode and an n-electrode, wherein the element regions are separated into two around a device center as a center of the entire light-emitting device in a plan view;

wherein each of the light-emitting regions is localized in the vicinity of a specific side among four sides of the element region, the specific side being a nearest side to the device center, and an area of each light-emitting region is 1% to 30% of the entire area of each element region; and wherein the p-electrodes are disposed between the light-emitting region and the n-electrode in a plan view.

* * * * *

UNITED STATES PATENT AND TRADEMARK OFFICE
CERTIFICATE OF CORRECTION

PATENT NO. : 10,069,039 B2
APPLICATION NO. : 15/265715
DATED : September 4, 2018
INVENTOR(S) : Boyama et al.

It is certified that error appears in the above-identified patent and that said Letters Patent is hereby corrected as shown below:

In the Claims

In Claim 1 at Column 11, Line 4-5, delete "of each element region"

Signed and Sealed this
Fourth Day of June, 2019

Andrei Iancu
*Director of the United States Patent and Trademark Office*